United States Patent
Furuta et al.

(10) Patent No.: US 7,679,946 B2
(45) Date of Patent: Mar. 16, 2010

(54) MEMORY ELEMENT ARRAY HAVING SWITCHING ELEMENTS INCLUDING A GAP OF NANOMETER ORDER

(75) Inventors: Shigeo Furuta, Tsukuba (JP); Yuichiro Masuda, Tsukuba (JP); Tsuyoshi Takahashi, Tsukuba (JP); Masatoshi Ono, Tsukuba (JP)

(73) Assignees: Funai Electric Advanced Applied Technology Research Institute Inc., Tsukuba-shi (JP); Funai Electric Co., Ltd., Dalto-shi (JP)

( * ) Notice: Subject to any disclaimer, the term of this patent is extended or adjusted under 35 U.S.C. 154(b) by 90 days.

(21) Appl. No.: 12/141,492

(22) Filed: Jun. 18, 2008

(65) Prior Publication Data

US 2008/0316797 A1 Dec. 25, 2008

(30) Foreign Application Priority Data

Jun. 22, 2007 (JP) .............................. 2007-165383

(51) Int. Cl.
G11C 13/00 (2006.01)
G11C 11/00 (2006.01)

(52) U.S. Cl. ...................................... 365/151; 365/148

(58) Field of Classification Search .................. 365/151
See application file for complete search history.

(56) References Cited

U.S. PATENT DOCUMENTS

| | | | | |
|---|---|---|---|---|
| 6,967,865 | B2* | 11/2005 | Lee | ............................ 365/163 |
| 2008/0232153 | A1* | 9/2008 | Naitoh et al. | ............... 365/148 |
| 2008/0315184 | A1* | 12/2008 | Furuta et al. | ................... 257/30 |
| 2009/0128221 | A1* | 5/2009 | Kam et al. | .................. 327/434 |
| 2009/0251199 | A1* | 10/2009 | Naitoh et al. | ............... 327/493 |

FOREIGN PATENT DOCUMENTS

| JP | 7-106440 A | 4/1996 |
|---|---|---|
| JP | 2005-79335 A | 3/2005 |

* cited by examiner

*Primary Examiner*—Son L Mai
(74) *Attorney, Agent, or Firm*—Crowell & Moring LLP

(57) ABSTRACT

Disclosed is a memory element array comprising a plurality of memory elements arranged in an array, wherein the memory elements are switching elements each including a gap of nanometer order in which a switching phenomenon of resistance is caused by applying a predetermined voltage between electrodes, and the memory element array is provided with tunnel elements respectively connected to the switching elements in series, each of the tunnel elements preventing generation of a sneak path current flowing to another switching element at a time of applying the predetermined voltage.

3 Claims, 5 Drawing Sheets

CURRENT PATHWAY A

CURRENT PATHWAY B

MEMORY ELEMENT ARRAY HAVING SWITCHING ELEMENTS INCLUDING A GAP OF NANOMETER ORDER

BACKGROUND OF THE INVENTION

1. Field of the Invention

The present invention relates to a memory element array.

2. Description of Related Art

With the miniaturization and the densification of devices, further miniaturization of electric elements is desired now. As an example, a switching element the switching operation of which is enabled by applying a voltage between two electrodes distant from each other by a minute gap (nanogap) is known.

To put it concretely, for example, a switching element has been developed which is made of stable materials, silicon oxide and gold, and can be manufactured by a simple manufacturing method, shadow evaporation, and further can repeat switching operations stably (see, for example, Japanese Patent Application Laid-Open Publication No. 2005-79335).

In order to apply such a switching element having a nanogap to a high-density memory, it is necessary to arrange the switching elements in array. However, if only switching elements are arranged in array, then sneak path currents may be generated, which causes a problem of making it difficult to read, write, and delete data.

Accordingly, a method of using a transistor or a diode to separate the switching element from an external circuit can be considered, for example, like a storage cell combining a laminated film of a nonlinear resistance layer and an insulation layer with a MOS transistor for separating the laminated film from the external circuit (see, for example, Japanese Patent Application Laid-Open Publication No. Hei 7-106440).

However, if a transistor or a diode is used for separating the switching element having a nanogap from the external circuit, then the following problems are caused: miniaturization is difficult because the number of impurity atoms greatly influences the characteristics of the switching element; and the number of processes of arraying is large and the processes are complicated.

SUMMARY OF THE INVENTION

It is an object of the present invention is to achieve the simplification of reading, writing, and deleting of data with a simple configuration in a memory element array using switching elements having nanogaps as memory elements.

According to a first aspect of the present invention, there is provided a memory element array including a plurality of memory elements arranged in an array, wherein the memory elements are switching elements each including a gap of nanometer order in which a switching phenomenon of resistance is caused by applying a predetermined voltage between electrodes, and the memory element array is provided with tunnel elements respectively connected to the switching elements in series, each of the tunnel elements preventing generation of a sneak path current flowing to another switching element at a time of applying the predetermined voltage.

According to a second aspect of the present invention, there is provided a memory element array including a plurality of memory elements arranged in an array, wherein the memory elements are switching elements each including a gap of nanometer order in which a switching phenomenon of resistance is caused by applying a predetermined voltage between electrodes, the memory element array is provided with tunnel elements respectively connected to the switching elements in series, each of the tunnel elements preventing generation of a sneak path current flowing to another switching element at a time of applying the predetermined voltage, and the switching elements and the tunnel elements are arranged to be aligned in a vertical direction, and to be connected with each other through conductive protection films respectively.

BRIEF DESCRIPTION OF THE DRAWINGS

The above and other objects, advantages and features of the present invention will become more fully understood from the detailed description given hereinbelow and the appended drawings which are given by way of illustration only, and thus are not intended as a definition of the limits of the present invention, and wherein.

DETAILED DESCRIPTION OF THE PREFERRED EMBODIMENTS

In the following, a concrete embodiment of the present invention will be described with reference to the attached drawings. However, the scope of the invention is not limited to the shown examples.

Figure 1:
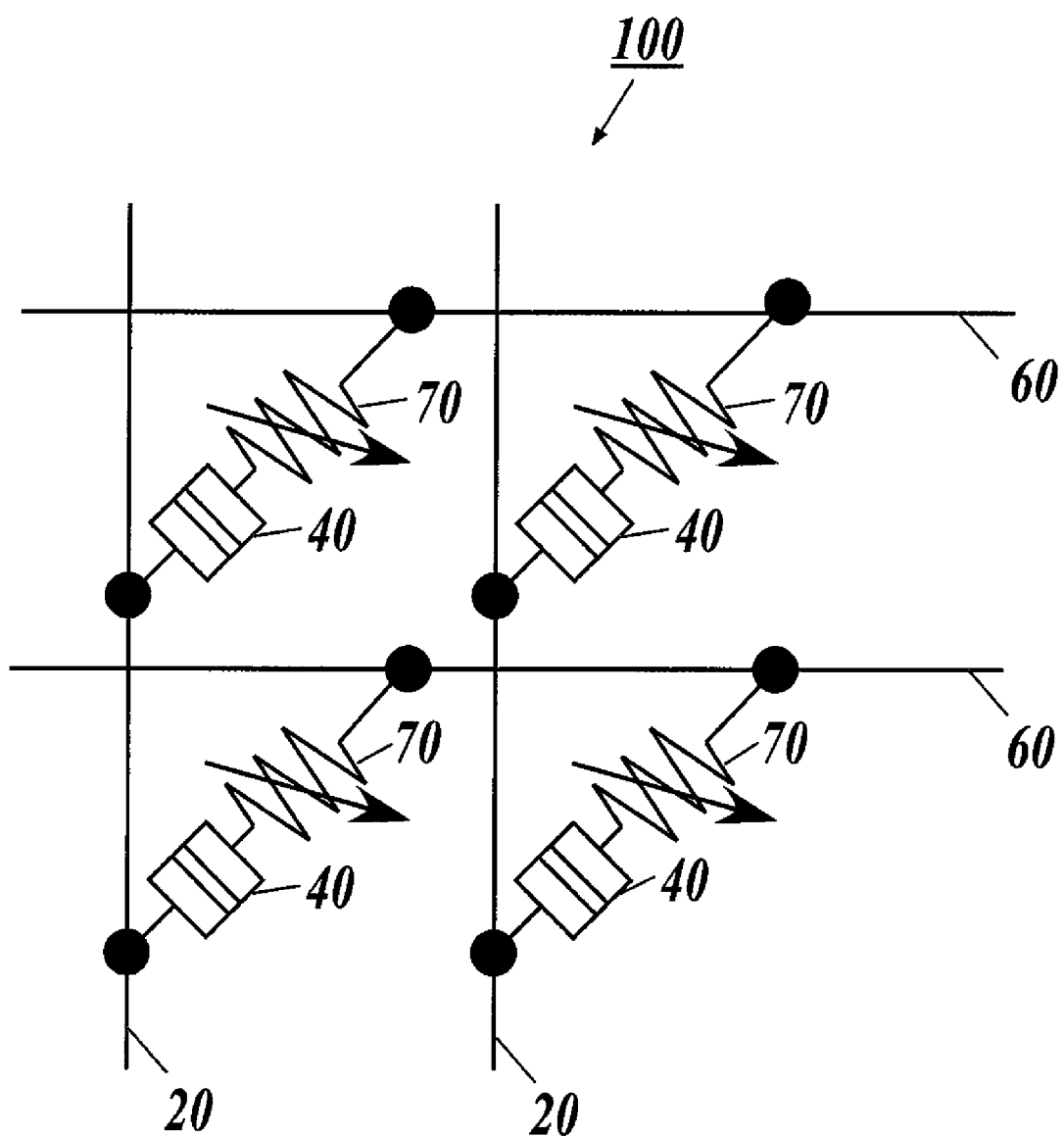
FIG. 1 is a circuit diagram of a memory element array exemplified as an embodiment to which the present invention is applied.
Figure 2:
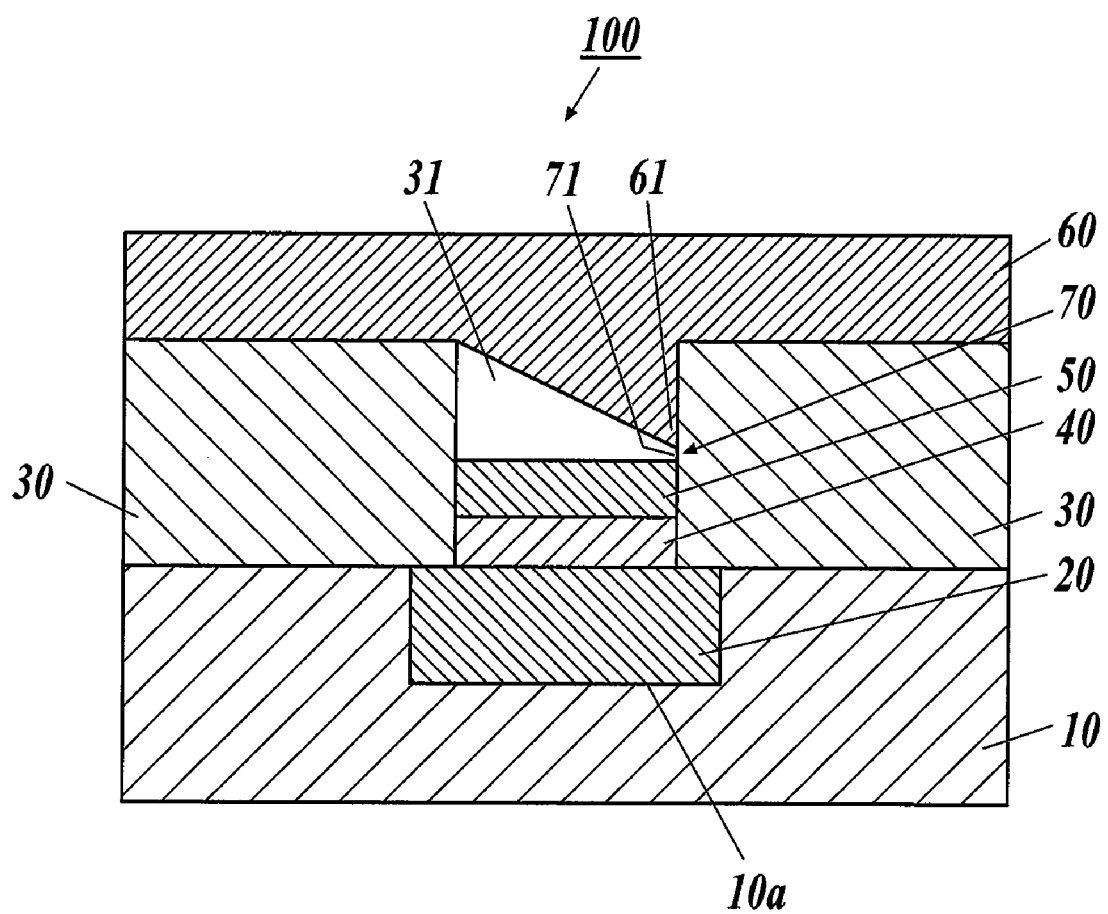
FIG. 2 is a sectional view schematically showing the principal part of the memory element array exemplified as the embodiment to which the present invention is applied.

FIG. 1 is a circuit diagram of a memory element array 100 exemplified as an embodiment to which the present invention is applied here. FIG. 2 is a sectional view schematically showing the principal part of the memory element array 100 exemplified as an embodiment to which the present invention is applied.

The memory element array 100 of the present embodiment is a high-density memory, in which a plurality of switching elements 70 as a plurality of memory elements are arranged in an array (two-dimensional array), for example, as shown in FIG. 1.

In the memory element array 100, each of the switching elements 70 is connected to each of tunnel elements 40 in series, for example, as shown in FIG. 1.

To put it concretely, the memory element array 100 includes, for example, as shown in FIG. 2, an insulation substrate 10 including concave portions 10a and a first electrode 20 provided in each of the concave portions 10a. The memory element array 100 further includes an insulating material 30 provided on the top surface of the insulation substrate 10, a tunnel element 40 provided on the top surface of each of the first electrodes 20, and a conductive protection film 50 provided on the top surface of each of the tunnel elements 40. The memory element array 100 further includes a second electrode 60 provided above each of the conductive protection films 50 and a switching element 70 including a nanogap 71 provided between each of the conductive protection films 50 and each of the second electrodes 60.

To put it concretely, the insulating material 30 is provided in contact with, for example, the top surface of the insulation substrate 10 to cover the first electrodes 20, and is equipped with holes 31 for exposing parts of the top surfaces of the first electrodes 20.

Each of the tunnel elements 40 is equipped on, for example, the top surface of the first electrodes 20 in each of the holes 31.

Each of the conductive protection films 50 is equipped on, for example, the top surface of each of the tunnel elements 40 in each of the holes 31.

Each of the second electrodes 60 is provided on, for example, the top surface of the insulating material 30 in contact with it, and is provided so as to isolate the insides of the holes 31 from the air by covering the aperture portions of the holes 31. Furthermore, each of the second electrodes 60 is equipped with second electrode projecting parts 61 to project toward the conductive protection films 50 at the parts to cover the aperture portions of the holes 31. Each of the tips of the second electrode projecting parts 61 is situated on, for example, the internal surface of each of the holes 31.

Each of the switching elements 70 includes a gap (nanogap 71) of the order of nanometer formed between, for example, the top surface of each of the conductive protection films 50 and the tip of each of the second electrode projecting parts 61. Each of the switching elements 70 is composed of, for example, the top surface of each of the conductive protection films 50 and the tip of each of the second electrode projecting parts 61.

The insulation substrate 10 constitutes a support member for providing, for example, the electrodes (first electrodes 20) of the memory element array 100 and the insulating material 30 thereon.

The structure and the quality of material of the insulation substrate 10 are not especially limited. To put it concretely, for example, the shape of the surface of the insulation substrate 10 may be a plane or a not-flat surface as long as the surface includes the concave portions 10a for providing the first electrodes 20. Moreover, the insulation substrate 10 may be, for example, a semiconductor substrate of Si or the like with an oxide film on its surface, or may be a substrate that has the insulation property in itself. Moreover, as the qualities of material of the insulation substrate 10, for example, glass, oxides such as silicon oxide ($SiO_2$), and nitrides such as silicon nitride (SiN) are preferable, and the silicon oxide ($SiO_2$) is ideal owing to the largeness of its adhesion property to the first electrodes 20 and the largeness of its freedom in the manufacturing thereof.

The insulating material 30 constitutes a support member for providing, for example, two kinds of electrodes of the memory element array 100 (first electrodes 20 and second electrodes 60) with a space between them.

The structure and the quality of material of the insulating material 30 are not especially limited. To put it concretely, for example, the shape of the surface of the insulating material 30 may be a plane or a not-flat surface as long as the surface includes the holes 31. Moreover, the insulating material 30 may be, for example, the insulation substrate 10 provided with an oxide film or the like on parts of it, or may be the insulation substrate 10 provided with an oxide film or the like on the whole surface thereof except for parts where the oxide film is removed. Moreover, as the quality of material of the insulating material 30, for example, glass, oxides such as silicon oxide ($SiO_2$), and nitrides such as silicon nitride (SiN) are preferable, and the silicon oxide ($SiO_2$) is ideal owing to the largeness of its adhesion property to the first electrodes 20 and the second electrode 60 and the largeness of its freedom in the manufacturing thereof.

Each of the first electrodes 20 is configured to receive applying a predetermined voltage so as to make each of the switching elements 70 perform a switching operation, for example, by being a pair with each of the second electrodes 60.

The shape of each of the first electrodes 20 is not especially limited as long as the first electrode 20 is provided in a concave portion 10a of the insulation substrate 10, and can suitably and arbitrarily be changed.

The quality of material of each of the first electrodes 20 is not especially limited, but it is preferable to be at least the one selected from, for example, gold, silver, platinum, palladium, nickel, aluminum, cobalt, chromium, rhodium, copper, tungsten, tantalum, carbon, and alloys of them. In order to strengthen the adhesion with the insulation substrate 10 and the insulating material 30, for example, two or more layers of different metals may be used to be piled up on each of them as each of the first electrodes 20 here. To put it concretely, each of the first electrodes 20 may be, for example, a laminated (multilayer) structure of chromium and gold.

Each of the tunnel elements 40 prevents the generation of a sneak path current flowing to another switching element 70 included in the memory element array 100 at the time of, for example, applying the predetermined voltage between the electrodes (between one of the first electrodes 20 and one of the second electrodes 60).

Moreover, each of the tunnel elements 40 is connected to each of the switching elements 70 in series through, for example, each of the conductive protection films 50 put between them.

Figure 4:
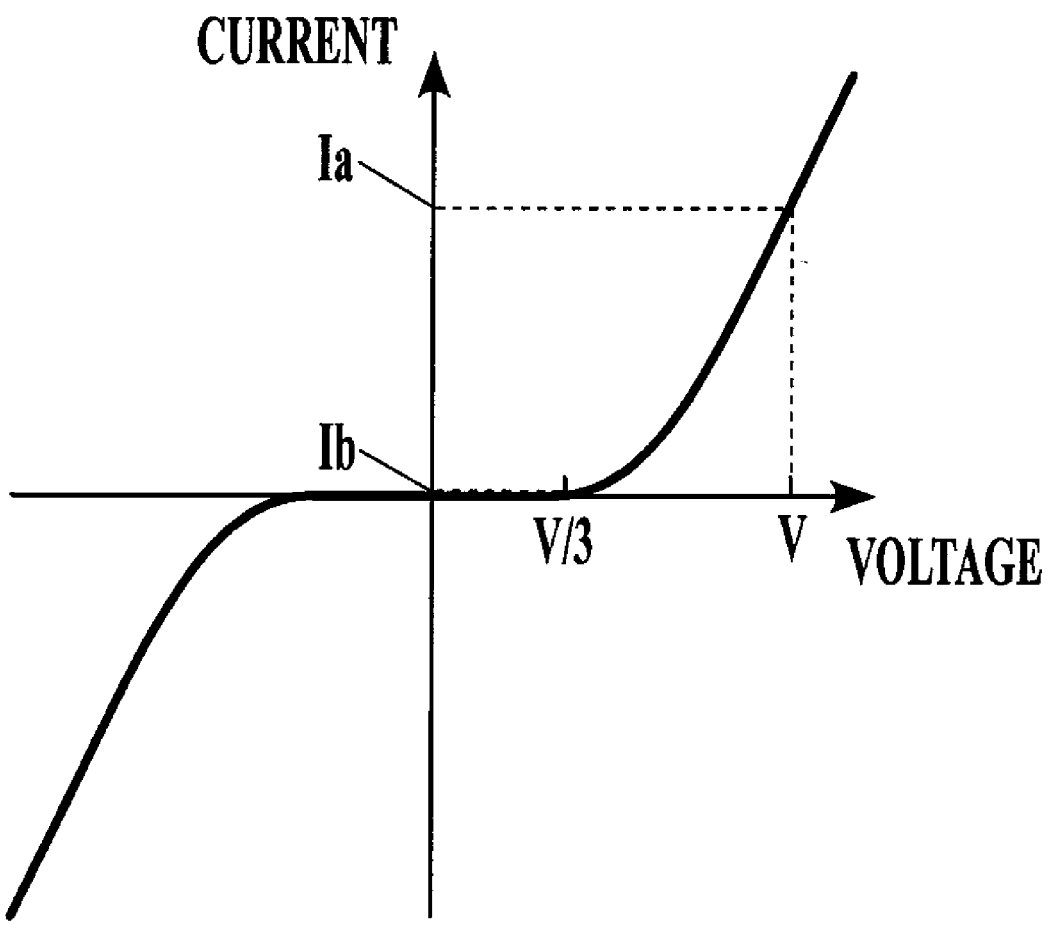
FIG. 4 is a diagram for illustrating the electric characteristic of a tunnel element provided in the memory element array.

The structure and the quality of material of each of the tunnel elements 40 are not especially limited, but an arbitrary element may be used as long as the tunnel effect can be observed in the element (see, for example, FIG. 4). To put it concretely, each of the tunnel elements 40 is formed by putting an insulating material between metals, for example, in the way of "a metal-an insulating material of several nm in thickness-a metal." As the metals, for example, gold, silver, copper, aluminum, titanium, tungsten, and nickel are preferable, but the metals are not especially limited to them. Moreover, as the insulating material, for example, $Al_2O_3$ and MgO are preferable, but the insulating material is not especially limited to the one made of them.

Each of the conductive protection films 50 enables the switching operation of each of the switching elements 70 by being paired with, for example, each of the second electrode projecting parts 61 of the second electrodes 60.

Moreover, each of the conductive protection films 50 separates, for example, each of the tunnel elements 40 from each of the switching elements 70 (nanogaps 71). Hereby, the stability of the switching operations by the switching elements 70 can be improved.

The structure and the quality of material of each of the conductive protection films 50 are not especially limited. To put it concretely, for example, the shape of the surface of each of the conductive protection films 50 may be a plane or a not-flat surface. Moreover, as the quality of material of the conductive protection films 50, for example, at least one of the selected ones of gold, silver, platinum, palladium, nickel, aluminum, cobalt, chromium, rhodium, copper, carbon, and alloys of them is preferable; and at least one of the selected ones of tungsten, tantalum, and titanium, which are chemically stable and have high melting points, and the alloys of them is more preferable.

The second electrodes 60 are adapted to receive applying a predetermined voltage for making each of the switching elements 70 perform a switching operation by being paired with, for example, each of the first electrodes 20.

Then, the second electrodes 60 enable the switching operations of the switching elements 70 by being paired with, for example, the top surfaces of the conductive protection films 50.

The shapes of the second electrodes 60 are not especially limited as long as the shape includes the second electrode projecting parts 61, and can suitably and arbitrarily be changed.

The qualities of material of the second electrodes 60 are not especially limited, but, for example, at least one of the selected ones from gold, silver, platinum, palladium, nickel, aluminum, cobalt, chromium, rhodium, copper, tungsten, tantalum, carbon, and the alloys of them. Two or more layers of different metals may be laminated to be used as each of the second electrodes 60 here in order to strengthen the adhesion thereof with the insulating material 30. To put it concretely, each of the second electrodes 60 may be configured as, for example, a laminated (multilayer) structure of chromium and gold.

Each of the switching elements 70 is, for example, an element including a gap (nanogap 71) in the order of nanometer in which a switching phenomenon of resistance occurs by the application of a predetermined voltage between electrodes (between each of the first electrodes 20 and each of the second electrodes 60).

Each of the widths of the nanogaps 71, that is, the distance (gap) G between the top surface of each of the conductive protection films 50 and the tip of each of the second electrode projecting parts 61 is preferably within the range of, for example, $0 \text{ nm} < G \leqq 13 \text{ nm}$, and more preferably within the range of $0.8 \text{ nm} < G < 2.2 \text{ nm}$.

The reason why the upper limit value of the distance G is set to 13 nm is that, for example, if the gap is formed by the shadow evaporation, no switching is caused in a gap interval larger than 13 nm.

On the other hand, the reason why the lower limit value of the distance G is set to a value larger than 0 nm is that, if the distance G is set to 0 nm, the state means that the conductive protection film 50 is short-circuited with the second electrode 60. Incidentally, it is difficult to determine the lower limit value by measurement using a microscope, but the lower limit value can be regarded as the minimum distance at which a tunnel current can be generated. That is, the lower limit value is a theoretical value of the distance at which a quantum mechanical tunneling effect can be observed with the current-voltage characteristic of the switching element 70 not complying with the Ohm's law.

Incidentally, the range of $0.8 \text{ nm} < G < 2.2 \text{ nm}$ can be obtained as a calculation result of the gap interval by substituting resistance values for the theoretical formula of the tunnel current.

Moreover, the direct-current electric resistance of each of the nanogaps 71 (between the top surfaces of the conductive protection film 50 and the tips of the second electrode projecting parts 61) is preferably, for example, larger than 1 k$\Omega$ and less than 10 T$\Omega$, and more preferably larger than 10 k$\Omega$.

The reason why the upper limit value of the resistance is set to 10 T$\Omega$ is that no switching is caused in case of 10 T$\Omega$ or more.

On the other hand, the reason why the lower limit value of the resistance is set to 1 k$\Omega$ is that the resistance has not been lower than 1 k$\Omega$ in the present condition, and the value of 1 k$\Omega$ has been set as the lower limit.

Incidentally, if the switching element 70 is considered as a switch, then the higher the resistance in its off state is, the better the switch is. Consequently, the upper limit value is preferably a higher value. However, if the resistance of the switching element 70 in its on state is 1 k$\Omega$, then a current of the order of several mA easily flows, and the possibility of destroying the other elements exists. Accordingly, it is preferable to set the lower limit value to about 10 k$\Omega$.

Incidentally, one or a plurality of adjacent portions (nanogaps 71) of the nanometer order between the top surface of each of the conductive protection films 50 and the tips of each of the second electrode projecting parts 61 may be formed in, for example, each of the regions in which the top surfaces of the conductive protection films 50 and the tips of the second electrode projecting parts 61 are opposed to each other.

Moreover, an island portion (sandbank portion) made of, for example, the components of the conductive protection films 50 and the second electrodes 60 may be formed between each of the top surfaces of the conductive protection films 50 and each of the tips of the second electrode projecting parts 61. In this case, only the thing required for the relations between each of the island portions and each of the surfaces and the tips is, for example, that predetermined gaps (nanogaps 71) are formed between each of the top surfaces of the conductive protection film 50 and each of the island portions and between each of the tips of the second electrode projecting parts 61 and the island portions, and that each of the top surfaces of the conductive protection films 50 and each of the tips of the second electrode projecting parts 61 are not short-circuited.

Next, the manufacturing method of the memory element array 100 is described.

The memory element array 100 is made by, for example, by (a) producing the first electrodes 20 in the concave portions 10a of the insulation substrate 10, (b) producing the insulating material 30 so as to cover the first electrodes 20 and forming the holes 31 in the insulating material 30 so as to expose a parts of the top surfaces of the first electrodes 20, (c) producing a tunnel elements 40 on the top surfaces of the first electrodes 20 in the holes 31, (d) producing the conductive protection films 50 on the top surfaces of the tunnel elements 40 in the holes 31, and (e) producing the second electrodes 60 on the top surface of the insulating material 30, in the aperture portions of the holes 31, and in the insides of the holes 31 by the shadow evaporation to form the switching elements 70 including nanogaps 71.

For example, optical lithography, dry etching, wet etching, and lift off can be used for the pattern producing of the wirings of the memory element array 100 (the first electrodes 20 and the second electrodes 60), the tunnel elements 40, the conductive protection films 50, and the like.

Incidentally, the manufacturing method of the memory element array 100 mentioned above is only one example, and the manufacturing method of the present invention is not limited to the method.

Next, the characteristics of the memory element array 100 are described with reference to FIGS. 3-5B.

Figure 3:
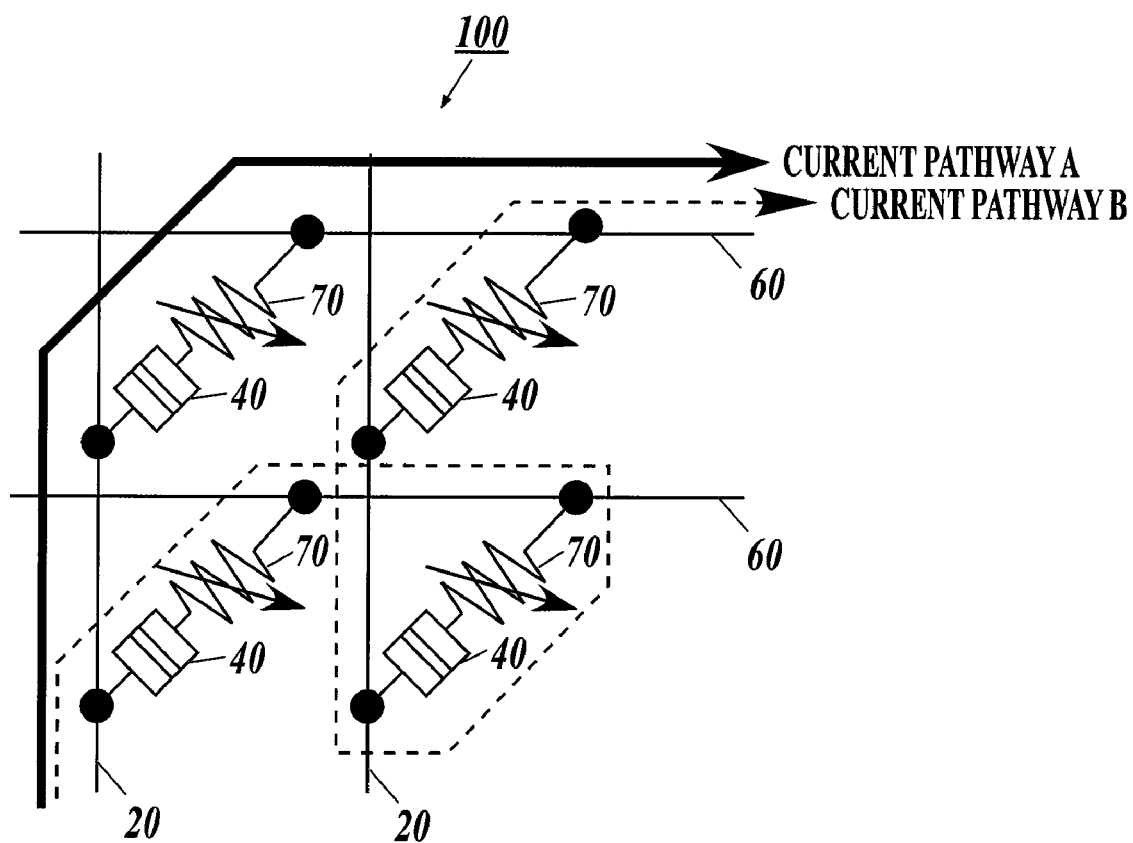
FIG. 3 is a diagram for illustrating a current pathway in the memory element array.

For example, as shown in FIG. 3, it is supposed that four or more pairs of the switching elements 70 and the tunnel elements 40 are arranged in an array (two-dimensional array) in the memory element array 100.

If a memory element array is not equipped with the tunnel elements 40 and equipped with only the switching elements 70 in an array, then when a predetermined voltage (for example, "V") is applied to a current pathway A (the pathway shown by a thick line in FIG. 3), a current also flows through a current pathway B (the pathway shown by a broken line in FIG. 3) owing to the sneaking besides the current pathway A to be the object.

On the other hand, in the case where the pairs of a switching element 70 and a tunnel element 40 are arranged in an array like the memory element array 100 of the present invention, when a predetermined voltage ("V") is applied to the current pathway A, a current flows only through the current pathway A to be the object.

This phenomenon is caused by the electric characteristics of the tunnel elements 40 such that the current-voltage curve of a tunnel element 40 draws, for example, a nonlinear curve shown in FIG. 4. In addition, the phenomenon is also caused by the fact that the tunnel elements 40 (pairs of each of the switching elements 70 and each of the tunnel elements 40) arranged in an array are mutually connected in series in the memory element array 100, for example, as shown in FIG. 5B.

Figure 5A:
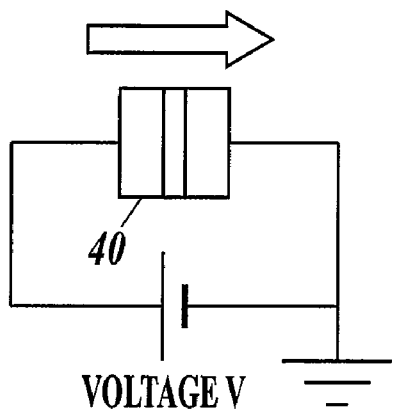
FIGS. 5A and 5B are circuit diagrams of the current pathway shown in FIG. 3.

For example, as shown in FIG. 5A, because the number of the tunnel elements 40 on the current pathway A is one, the applied voltage "V" is applied to the tunnel element 40. Consequently, a current "Ia" corresponding to the voltage "V" flows through the current pathway A, for example, as shown in FIG. 4.

Figure 5B:
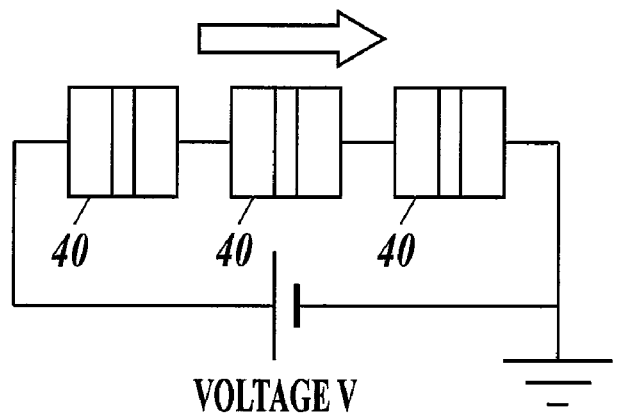

On the other hand, for example, as shown in FIG. 5B, because the number of the tunnel elements 40 on the current pathway B is three, an applied voltage "V/3" is applied to each of the tunnel elements 40. Consequently, a current "Ib" corresponding to the voltage "V/3" flows through the current pathway B, for example, as shown in FIG. 4.

Accordingly, the sneak path current (such as the current flowing through the current pathway B) can be prevented by using the difference between the currents "Ia" and "Ib" by setting the voltage to be applied according to the electric characteristics of the tunnel elements 40.

Incidentally, although the switching elements 70 are omitted to be shown in FIGS. 5A and 5B for convenience' sake, it is needless to say that the switching elements 70 also exist on the circuits of the current pathway A and the current pathway B.

According to the memory element array 100 of the present invention described above, the switching elements 70, each having a gap of the order of nanometer (nanogap 71), in which the switching phenomenon of resistance is caused by applying a predetermined voltage to the electrodes (each of the first electrodes 20 and each of the second electrodes 60), are arranged in an array, and the memory element array 100 is equipped with the tunnel elements 40, each connected with each of the switching elements 70 in series, which prevent the occurrence of sneak path currents to the other switching elements 70 at the time of the application of the predetermined voltage.

That is, only by the simple configuration of providing the tunnel elements 40, the simplification of the reading, the writing, and the deleting of data can be achieved.

Moreover, because the switching elements 70 are the elements in each of which the tunneling can be observed similarly to the tunnel elements 40, the switching elements 70 has good affinity with the tunnel elements 40. Consequently, the switching elements 70 can stably repeat the switching operations in the case where they are combined with the tunnel elements rather than the case where they are combined with transistors and diodes.

Moreover, according to the memory element array 100 of the present invention, each of the switching elements 70 and each of the tunnel elements 40 are connected with each other through the conductive protection film 50.

That is, the switching element 70 and the tunnel element 40 are separated from each other by the conductive protection film 50, and consequently the stability of the switching operation of the switching element 70 can be improved.

Moreover, according to the memory element array 100 of the present invention, each of the switching elements 70 and each of the tunnel elements 40 are arranged to be aligned in a vertical direction (that is, almost the perpendicular direction to the top surface of the insulation substrate 10).

That is, the conductive protection film 50 (the top surface of the conductive protection film 50) and the second electrode projecting part 61 (the tip of the second electrode projecting part 61), both constituting each of the switching elements 70, are arranged to be aligned in the vertical direction, and the conductive protection film 50 and the tunnel element 40 are arranged to be aligned in the vertical direction. Consequently, the integration degree of the memory element array 100 can be improved.

Incidentally, the present invention is not limited to the embodiment described above, but various improvements and changes of design can be performed without departing from the spirit and the scope of the present invention.

The conductive protection films 50 are not necessarily provided. If the conductive protection films 50 are not equipped, the top surface of each of the tunnel elements 40 and the tip of each of the second electrode projecting parts 61 constitute each of the switching elements 70.

Although the conductive protection film 50 and the second electrode projecting part 61, both constituting each of the switching elements 70, are arranged to be aligned in the vertical direction, and the conductive protection film 50 and each of the tunnel elements 40 are arranged to be aligned in the vertical direction, the arrangements of them are not limited to this way. For example, the conductive protection film 50 and the second electrode projecting part 61 may be arranged to be aligned in a lateral direction, or the conductive protection film 50 and the tunnel element 40 may be arranged to be aligned in the lateral direction.

The configuration and the shape of each section of the memory element array 100 that have been exemplified in the embodiment described above are only examples, and the configuration and the shape are not limited to those described above.

According to a first aspect of the preferred embodiments of the present invention, there is provided a memory element array including a plurality of memory elements arranged in an array, wherein the memory elements are switching elements each including a gap of nanometer order in which a switching phenomenon of resistance is caused by applying a predetermined voltage between electrodes, and the memory element array is provided with tunnel elements respectively connected to the switching elements in series, each of the tunnel elements preventing generation of a sneak path current flowing to another switching element at a time of applying the predetermined voltage.

Preferably, in the memory element array, the switching elements and the tunnel elements are connected with each other through conductive protection films respectively.

According to a second aspect of the preferred embodiments of the present invention, there is provided a memory element array including a plurality of memory elements arranged in an array, wherein the memory elements are switching elements each including a gap of nanometer order in which a switching phenomenon of resistance is caused by applying a predetermined voltage between electrodes, the memory element array is provided with tunnel elements respectively connected to the switching elements in series, each of the tunnel elements preventing generation of a sneak path current flowing to another switching element at a time of applying the predetermined voltage, and the switching elements and the tunnel elements are arranged to be aligned in a vertical direction, and to be connected with each other through conductive protection films respectively.

According to the present invention, in a memory element array including a plurality of memory elements arranged in an array, each of the memory elements is a switching element to include a gap of nanometer order, in which a switching phenomenon of resistance is caused by applying a predetermined voltage between electrodes, and the memory element array is provided with a tunnel element connected to the switching element in series, the tunnel element preventing generation of a sneak path current flowing to another switching element at a time of applying of the predetermined voltage.

That is, only by the simple configuration of being provided with the tunnel element, the simplification of the reading, the writing, and the deleting of data can be achieved.

The entire disclosure of Japanese Patent Application No. 2007-165383 filed on Jun. 22, 2007 including description, claims, drawings, and abstract are incorporated herein by reference in its entirety.

Although various exemplary embodiments have been shown and described, the invention is not limited to the embodiments shown. Therefore, the scope of the invention is intended to be limited solely by the scope of the claims that follow.

What is claimed is:

1. A memory element array comprising a plurality of memory elements arranged in an array, wherein
   the memory elements are switching elements each including a gap of nanometer order in which a switching phenomenon of resistance is caused by applying a predetermined voltage between electrodes, and
   the memory element array is provided with tunnel elements respectively connected to the switching elements in series, each of the tunnel elements preventing generation of a sneak path current flowing to another switching element at a time of applying the predetermined voltage.

2. The memory element array according to claim 1, wherein the switching elements and the tunnel elements are connected with each other through conductive protection films respectively.

3. A memory element array comprising a plurality of memory elements arranged in an array, wherein
   the memory elements are switching elements each including a gap of nanometer order in which a switching phenomenon of resistance is caused by applying a predetermined voltage between electrodes,
   the memory element array is provided with tunnel elements respectively connected to the switching elements in series, each of the tunnel elements preventing generation of a sneak path current flowing to another switching element at a time of applying the predetermined voltage, and
   the switching elements and the tunnel elements are arranged to be aligned in a vertical direction, and to be connected with each other through conductive protection films respectively.

* * * * *